(12) United States Patent
JangJian et al.

(10) Patent No.: US 9,406,797 B2
(45) Date of Patent: Aug. 2, 2016

(54) SEMICONDUCTOR INTEGRATED CIRCUIT WITH DISLOCATIONS

(71) Applicant: Taiwan Semiconductor Manufacturing Company, Ltd., Hsin-Chu (TW)

(72) Inventors: Shiu-Ko JangJian, Tainan (TW); Chun-Chieh Wang, Kaohsiung (TW); Shih-Chieh Chang, Taipei (TW); Ying-Min Chou, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 9 days.

(21) Appl. No.: 14/201,413

(22) Filed: Mar. 7, 2014

(65) Prior Publication Data
US 2015/0255602 A1    Sep. 10, 2015

(51) Int. Cl.
| | |
|---|---|
| *H01L 29/76* | (2006.01) |
| *H01L 29/78* | (2006.01) |
| *H01L 21/02* | (2006.01) |
| *H01L 21/265* | (2006.01) |
| *H01L 21/3105* | (2006.01) |
| *H01L 21/324* | (2006.01) |
| *H01L 29/165* | (2006.01) |
| *H01L 29/417* | (2006.01) |
| *H01L 29/32* | (2006.01) |
| *H01L 29/08* | (2006.01) |
| H01L 29/66 | (2006.01) |

(52) U.S. Cl.
CPC ...... *H01L 29/7847* (2013.01); *H01L 21/02362* (2013.01); *H01L 21/26506* (2013.01); *H01L 21/26513* (2013.01); *H01L 21/31055* (2013.01); *H01L 21/324* (2013.01); *H01L 29/0847* (2013.01); *H01L 29/165* (2013.01); *H01L 29/32* (2013.01); *H01L 29/41725* (2013.01); *H01L 29/66575* (2013.01); *H01L 29/78* (2013.01); *H01L 29/7843* (2013.01); *H01L 29/7848* (2013.01); *H01L 29/66545* (2013.01)

(58) Field of Classification Search
CPC ................... H01L 29/7847; H01L 29/7848
USPC ................................ 257/288; 438/285
See application file for complete search history.

(56) References Cited

U.S. PATENT DOCUMENTS

| | | | |
|---|---|---|---|
| 8,193,049 B2 * | 6/2012 | Golonzka | ....... H01L 21/823807 257/369 |
| 2005/0056899 A1 * | 3/2005 | Rendon et al. | ................ 257/408 |
| 2007/0252205 A1 * | 11/2007 | Hoentschel | ............. H01L 21/84 257/347 |
| 2010/0038685 A1 * | 2/2010 | Weber | ............... H01L 21/26506 257/288 |
| 2013/0099314 A1 * | 4/2013 | Lu | ..................... H01L 21/26506 257/347 |
| 2013/0149807 A1 | 6/2013 | JangJian et al. | |
| 2013/0323894 A1 * | 12/2013 | Yin | ................. H01L 21/823814 438/232 |

* cited by examiner

*Primary Examiner* — David Vu
*Assistant Examiner* — Brandon Fox
(74) *Attorney, Agent, or Firm* — Haynes and Boone, LLP

(57) ABSTRACT

A method of fabricating a semiconductor integrated circuit (IC) is disclosed. The method includes proving a substrate. The substrate includes a gate stack over the substrate and source/drain regions separated by the gate stack. A first dislocation with a first pinch-off point is formed within the source/drain region with a first depth. A second dislocation with a second pinch-off point is formed within the source/drain region at a second depth. The second depth is substantial smaller than the first depth.

20 Claims, 11 Drawing Sheets

SEMICONDUCTOR INTEGRATED CIRCUIT WITH DISLOCATIONS

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, stress effects improve charge mobility through a transistor channel, thereby improving device performance is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
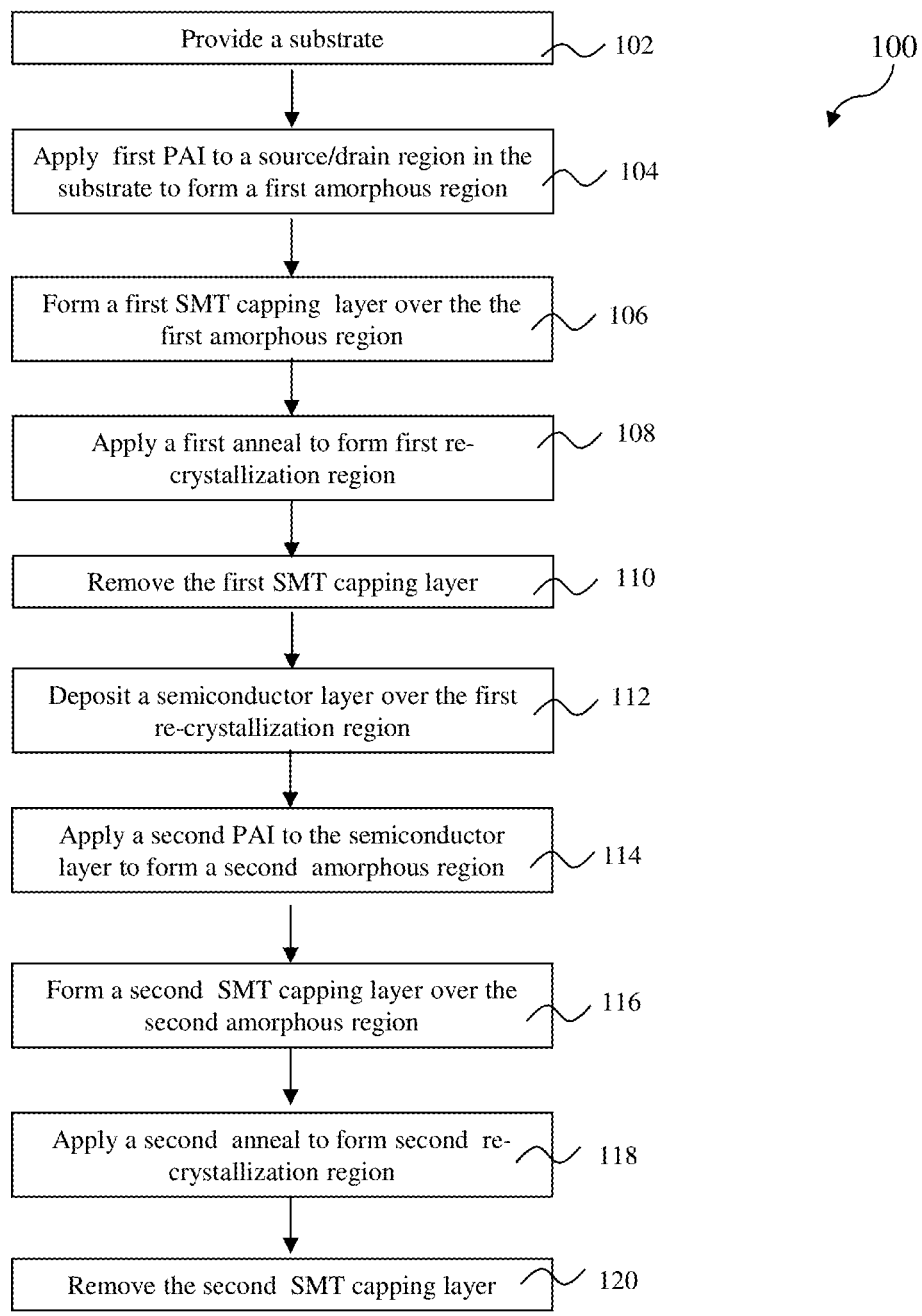
FIG. 1 is a flowchart of an example method for fabricating a semiconductor integrated circuit (IC) constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more IC devices in accordance with some embodiments. The method 100 is discussed in detail below, with reference to an IC device 200, shown in FIGS. 2 to 10 for the sake of example.

Figure 2:
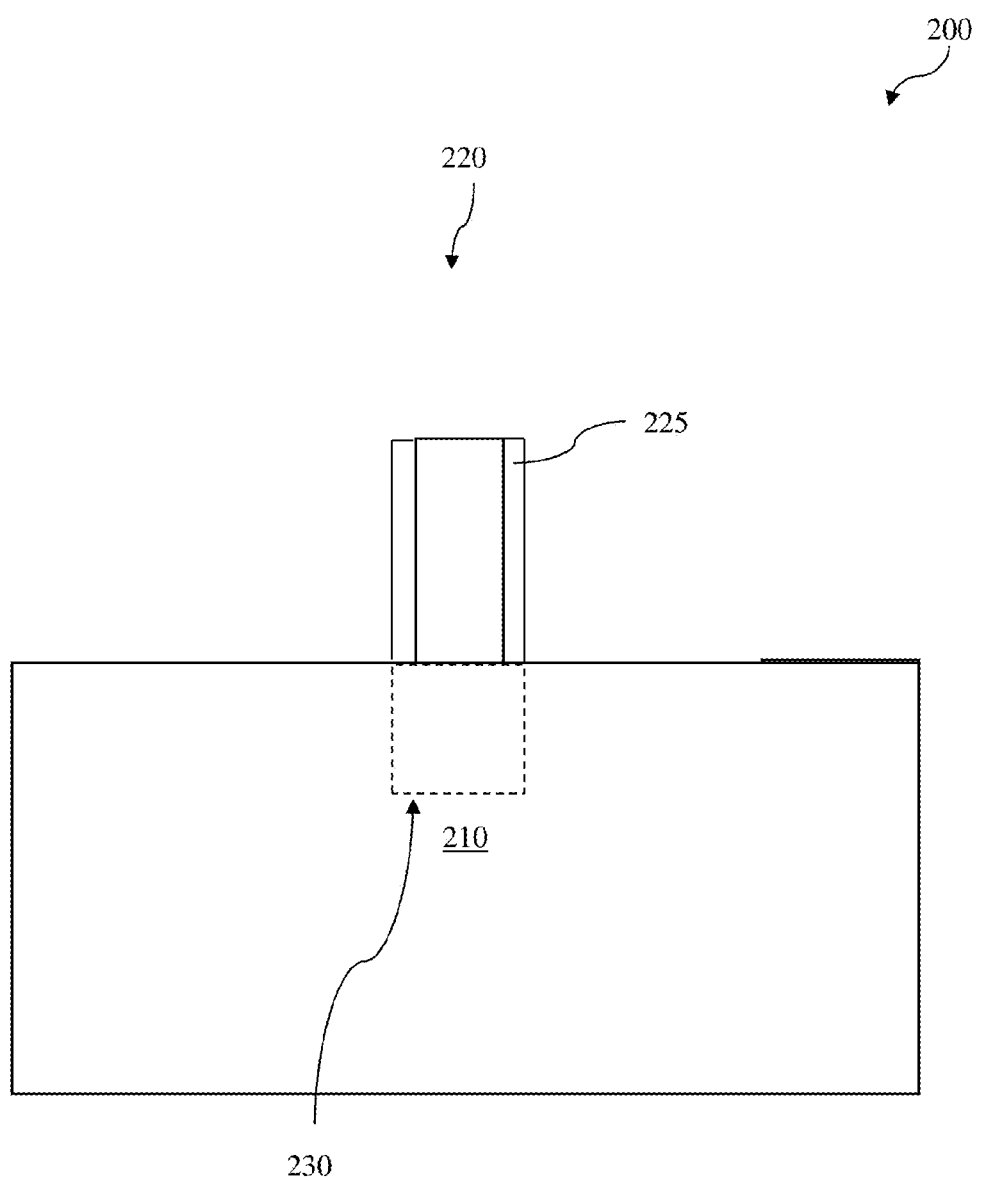
FIGS. 2 to 11 are cross sectional views of an example IC device constructed at fabrication stages in accordance with some embodiments.

Referring to FIGS. 1 and 2, the method 100 begins at step 102 by providing a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide, or combinations thereof. Possible substrates 210 also include a silicon-on-insulator (SOI) substrate. SOI substrates are fabricated using separation by implantation of oxygen (SIMOX), wafer bonding, and/or other suitable methods.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor (NMOS) transistor device and regions configured for a P-type metal-oxide-semiconductor (PMOS) transistor device.

The substrate 210 may include isolation regions 212 to isolate active regions of the substrate 210. The isolation region 212 may be formed using traditional isolation technology, such as shallow trench isolation (STI), to define and electrically isolate the various regions. The isolation region 212 comprises silicon oxide, silicon nitride, silicon oxynitride, an air gap, other suitable materials, or combinations thereof. The isolation region 212 is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

The substrate 210 includes a gate stack 220 over the substrate 210 and a gate spacer 225 along sidewalls of the first gate stack 220. The gate stack 220 may include a dielectric layer and a gate electrode layer. The first gate stack 220 can be formed by a procedure including deposition, photolithography patterning, and etching processes. The deposition processes may include chemical vapor deposition (CVD), physical vapor deposition (PVD), atomic layer deposition (ALD), or other suitable processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods.

In present embodiment, the first gate stack 220 is a dummy gate stack and is replaced later by a high-k/metal gate (HK/MG). The dummy gate stack 220 may include the dielectric layer and the polysilicon layer.

The gate spacers 225 include a dielectric material such as silicon oxide. Alternatively, the gate spacers 225 may include silicon nitride, silicon carbide, silicon oxynitride, or combinations thereof. The gate spacers 225 may be formed by depositing a dielectric material over the first gate stack 220 and then anisotropically etching back the dielectric material. A region locates underneath the gate stack 220 in the substrate 210 is referred to as a gate region 230.

Once the substrate 210 is received, it undergoes a stress-memorization technique (SMT) in steps 104-120 of the method 100. The SMT increases charge mobility through a channel formed in the gate region 230. This leads to dramatic improvements in device performance by demonstrating higher drive strength for a given channel size and supply voltage. In brief, the SMT technique involves processes, such as pre-amorphization implantation (PAI), SMT capping layer deposition and thermal annealing. The gate region 230 retains stress effects caused by the SMT. These retained effects may be referred to as stress-memorization, thus giving SMT its name. After the SMT is completed, further FinFET manufacturing steps may be performed.

Figure 3:
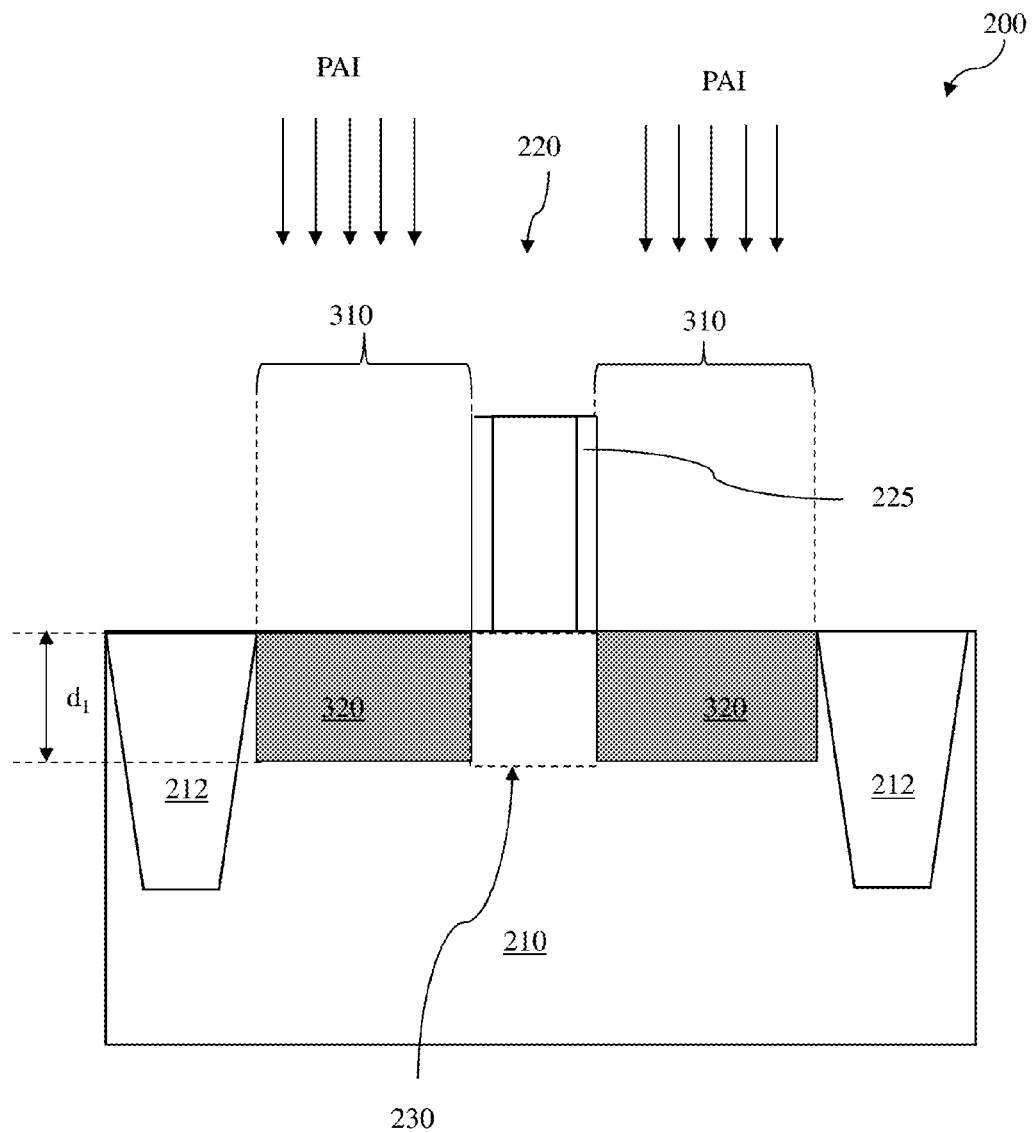

Referring to FIGS. 1 and 3, the method 100 proceeds to step 104 by applying a first PAI to form a first amorphous region 320 within a source/drain region 310 in the substrate 210. The source/drain region 310 is a region which is adjacent to and separated by the gate stack 220. The PAI injects atoms into a top portion of the source/drain region 310. By introducing energetic doping species, such as Si, Ge, Ar, Xe, $BF_2$, As, and/or In into the source/drain region 310, the implantation damages the molecular lattice. This creates an amorphous region 320 within the semiconductor material of the source/drain region 310 down to a first depth $d_1$. The first depth $d_1$ is determined according to design specifications and can be controlled by the first PAI process implant energy, implant species, implantation angle and/or implant dosage. The source/drain region 310 may undergo multiple implantations utilizing a variety of energies, species, angles and dosages. In one embodiment, germanium (Ge) is the species implanted.

In some embodiments, a patterned photoresist layer may be utilized to define where the first amorphous region 320 is to be formed and to protect other regions of the substrate 210 from implantation damage. For example, the patterned photoresist layer exposes the source/drain region 310 to the first PAI process (forming the first amorphous region 320) while the gate stack 220 (and other portions of the substrate) are protected from the first PAI process.

Figure 4:
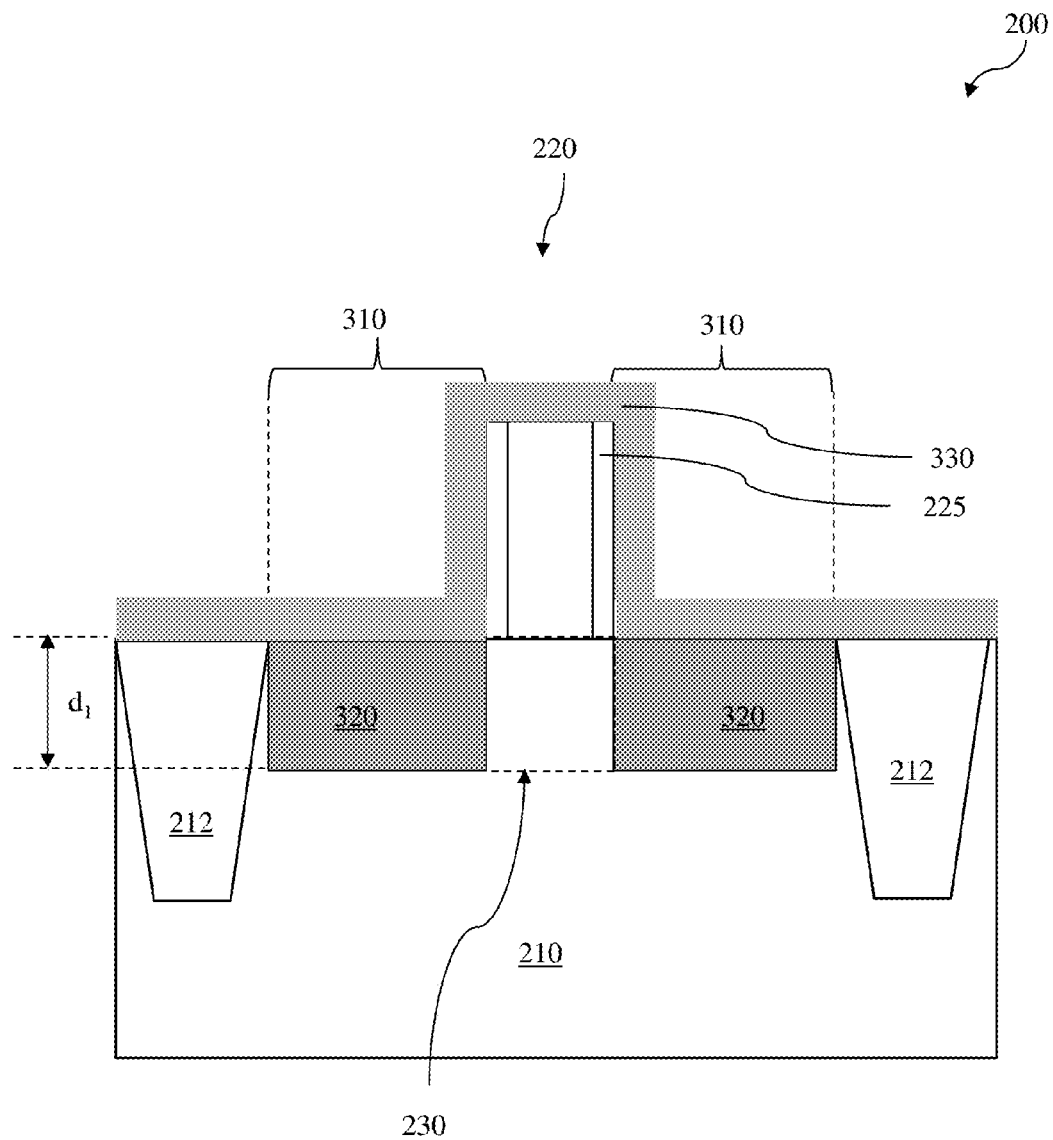

Referring to FIGS. 1 and 4, the method 100 proceeds to step 106 by forming a first SMT capping layer 330 over the substrate 210, including the first amorphous region 320. In the present embodiment, the first SMT capping layer 330 is formed as a tensile stress type film. The first SMT capping layer 330 may include silicon oxide, silicon nitride, oxynitride, silicon carbide, titanium oxide, titanium nitride, tantalum oxide, tantalum nitride, or any suitable materials. The first SMT capping layer 330 may be formed by PVD, CVD or other suitable techniques.

Figure 5:
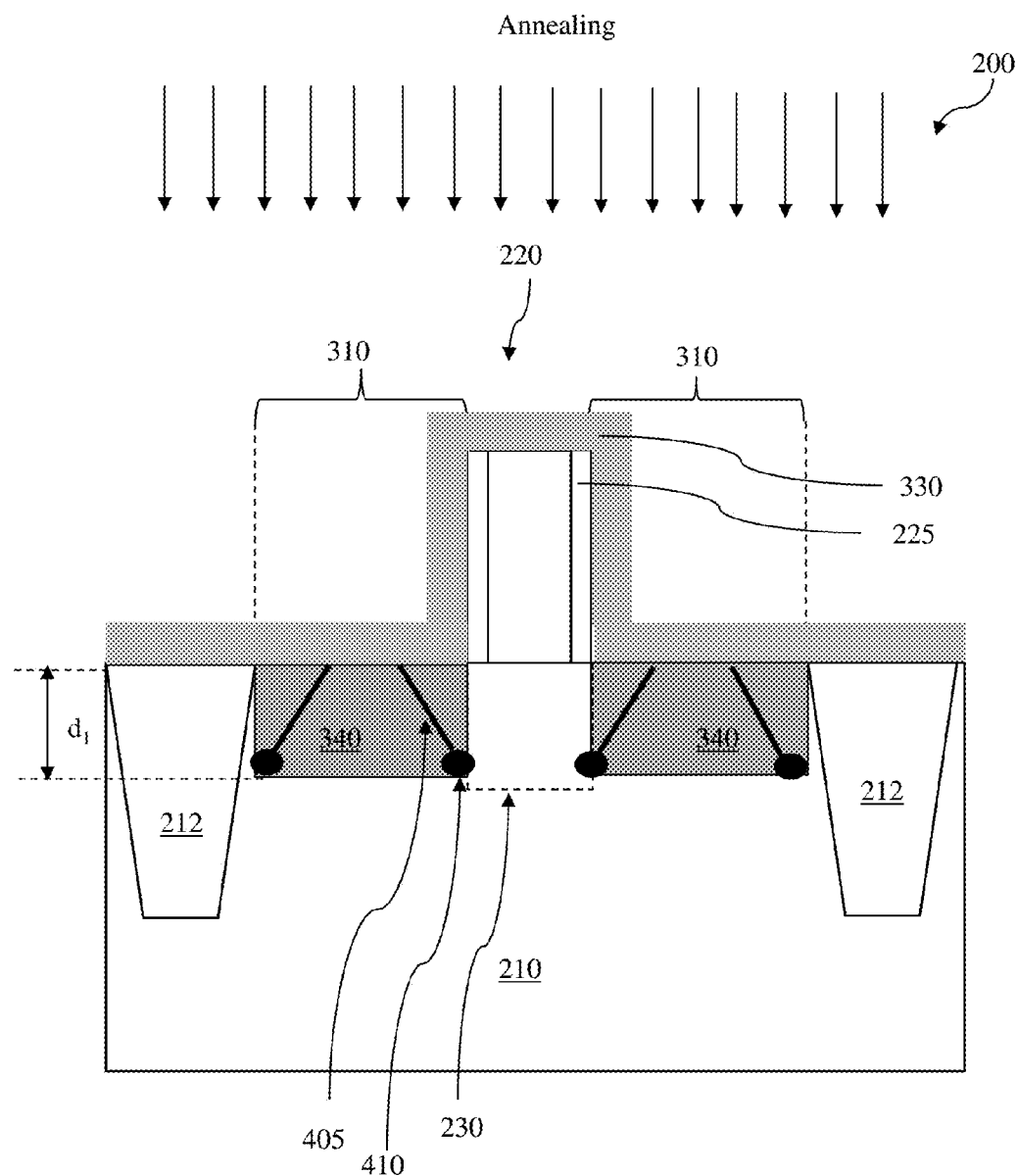

Referring to FIGS. 1 and 5, the method 100 proceeds to step 108 by applying a first annealing process to the substrate 210, including the first amorphous region 320. The annealing process re-crystallizes the first amorphous regions 320 created during the PAI, referred to as a first re-crystallization region 340. However, a stress during annealing prevents uniform crystal formation. The re-crystallized region 340 will contain irregularities such as regions that are locally uniform but exhibit misalignments with other regions. This misalignment may result in imperfections known as dislocations.

Due to the stress applied during SMT steps such as SMT layer implantation, deposition and annealing, the first re-crystallization region 340 may contain dislocations in the semiconductor lattice. Dislocations 405 begin at a first pinch-off point 410. The depth and location of the first pinch-off point 410 is set according to design specifications and is a function of the pre-amorphization implantation and the annealing process. In one embodiment, the first pinch-off point 410 locates at a bottom corner of the first re-crystallization region 340, which is at the first depth $d_1$. From the first pinch-off point 410, the dislocation 405 propagates along one or more planes towards to a top surface of the source/drain region 310.

The annealing process may be a rapid thermal anneal (RTA) or a millisecond thermal anneal (MSA), such as a millisecond laser thermal anneal. In one embodiment, the annealing process is implemented in a rapid thermal annealing (RTA) tool. In another embodiment, the annealing process is applied to the substrate 210 with an annealing temperature ranging between about 2000° C. and about 1050° C. In another embodiment, the annealing process is applied to the substrate 210 with an annealing duration ranging between about 5 seconds and about 30 seconds. The annealing process may include a long range pre-heat, which minimizes or even eliminates end of range (EOR) defects.

Figure 6:
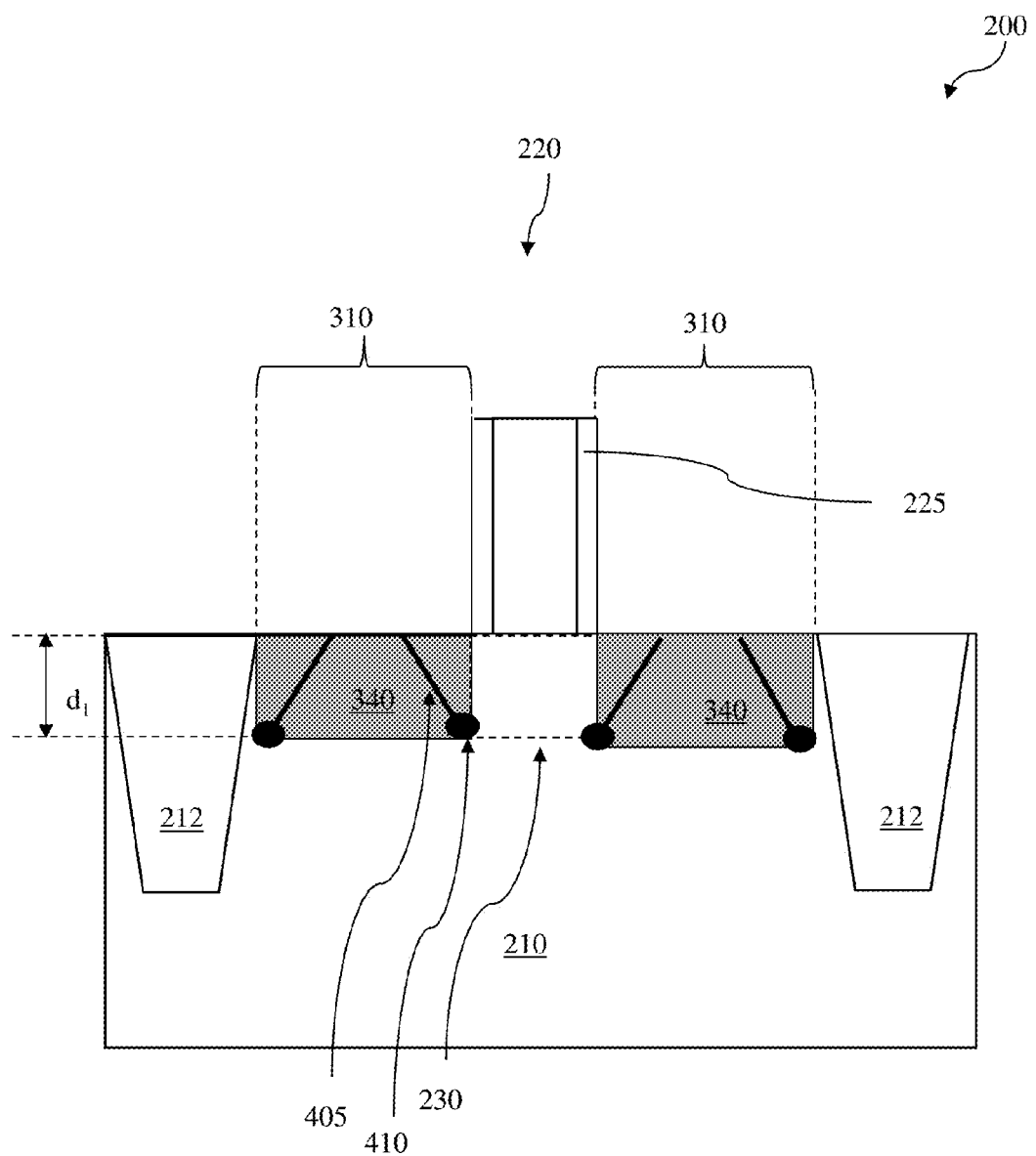

Referring to FIGS. 1 and 6, the method 100 proceeds to step 110 by removing the first SMT capping layer 330. The removal process may include a wet etching or a dry etching process. For an example, the SMT silicon nitride capping layer 330 is removed by an etching process involving phosphoric acid. For another example, the silicon oxide SMT capping layer 330 is etched away by a hydrofluoric acid (HF) or buffered HF.

Figure 7:
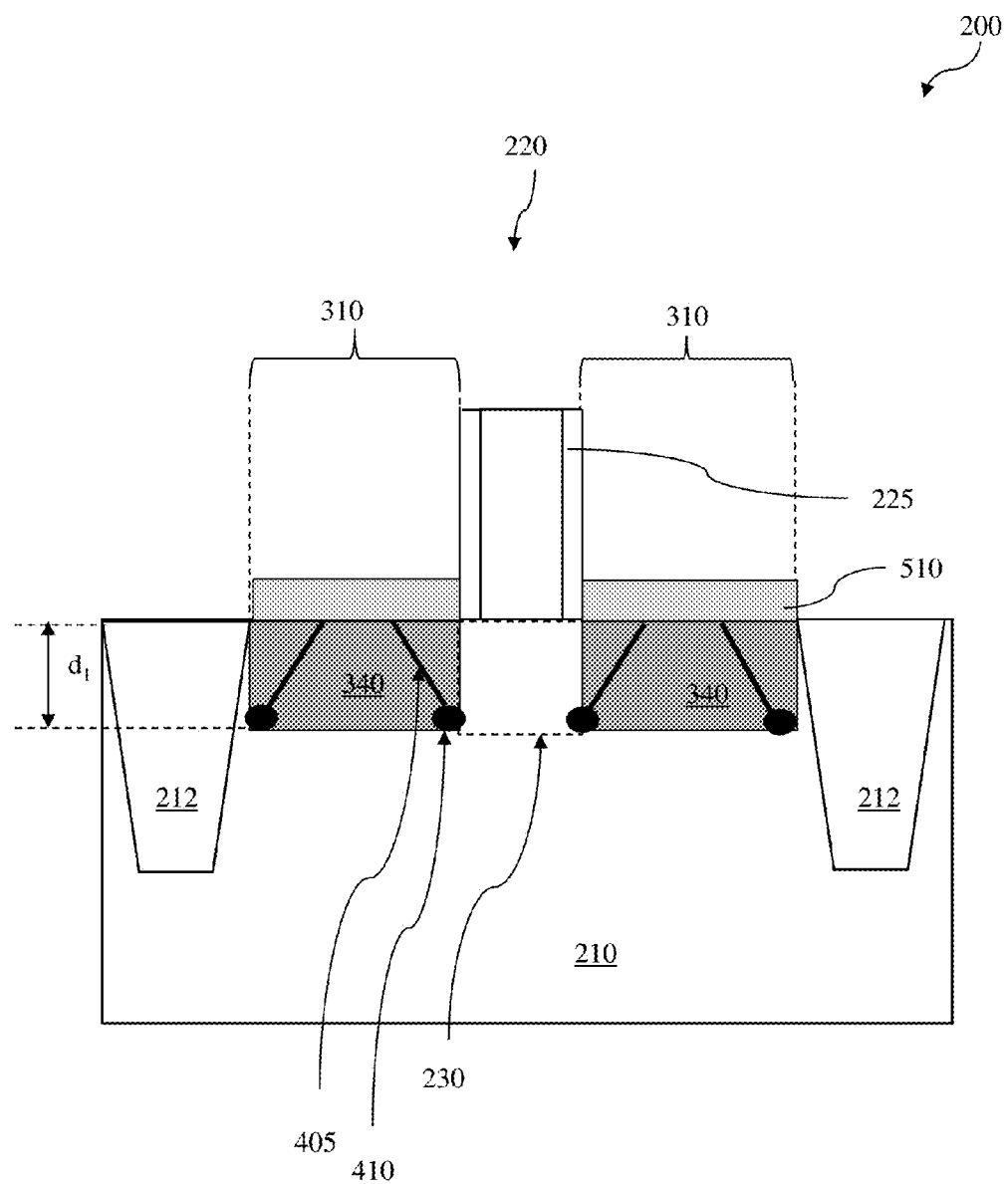

Referring to FIGS. 1 and 7, the method 100 proceeds to step 112 by forming semiconductor layer 510 over the first re-crystallization region 340. The semiconductor layer 510 includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The semiconductor layer 510 may be deposited by an epitaxial process such as CVD deposition techniques (e.g., vapor-phase epitaxy (VPE) and/or ultra-high vacuum CVD (UHV-CVD)), molecular beam epitaxy, and/or other suitable processes. In one embodiment, a SiGe layer 510 is selectively formed over the Si re-crystallization region 340.

Figure 8:
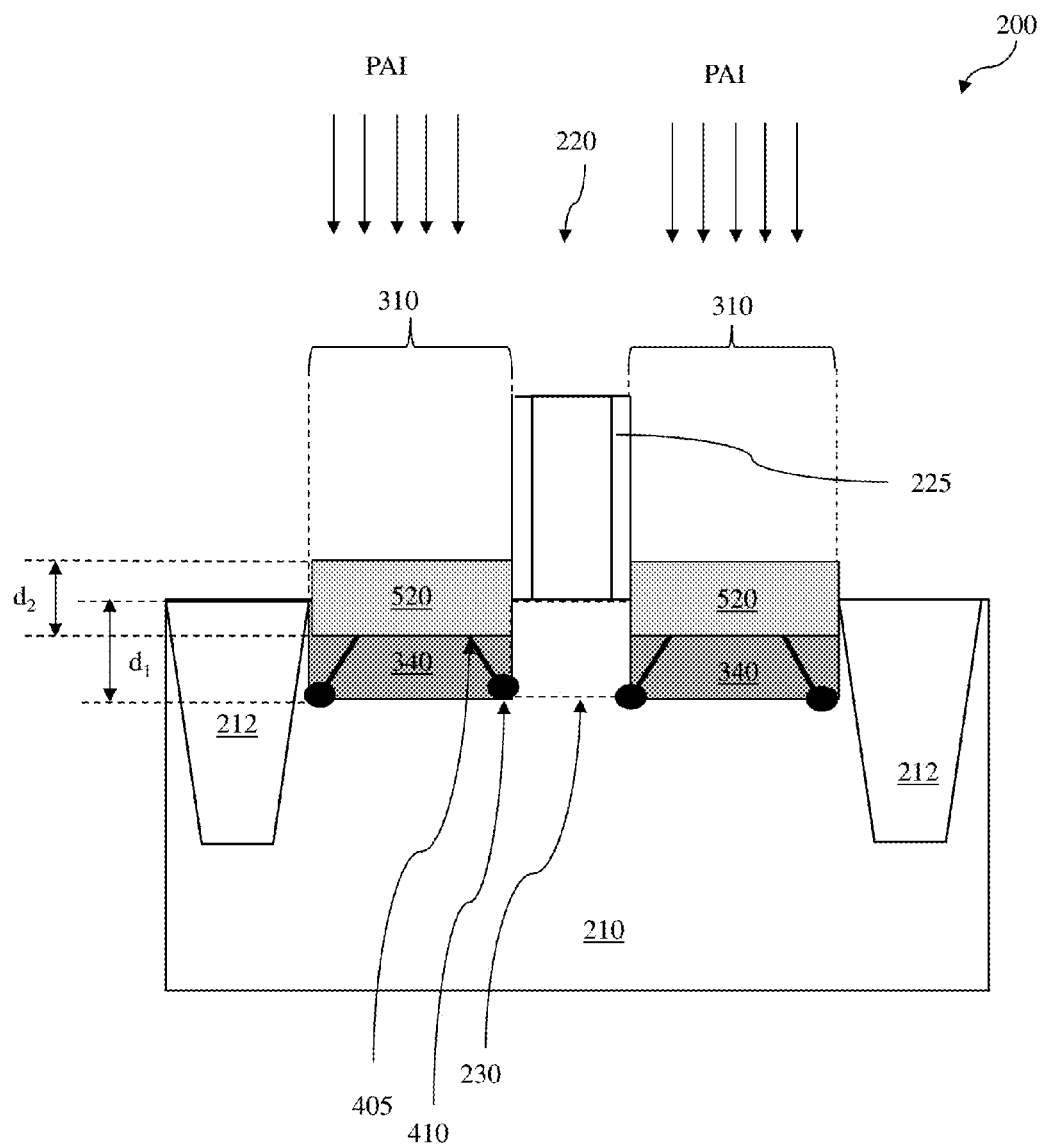

Referring to FIGS. 1 and 8, the method 100 proceeds to step 114 by applying a second PAI to form a second amorphous region 520 in semiconductor layer 510. The second PAI is similar in many respects to the first PAI discussed above in association with FIG. 3. But, comparing to the first PAI, the second PAI is controlled to be a shallower implantation and creates the second amorphous region 520 within the semiconductor layer 510 down to a second depth $d_2$. The second depth $d_2$ is determined according to design specifications and can be controlled by the second PAI process implant energy, implant species, implantation angle and/or implant dosage. The second depth $d_2$ is substantial smaller than the first depth $d_1$. In one embodiment, germanium (Ge) is the species implanted.

Figure 9:
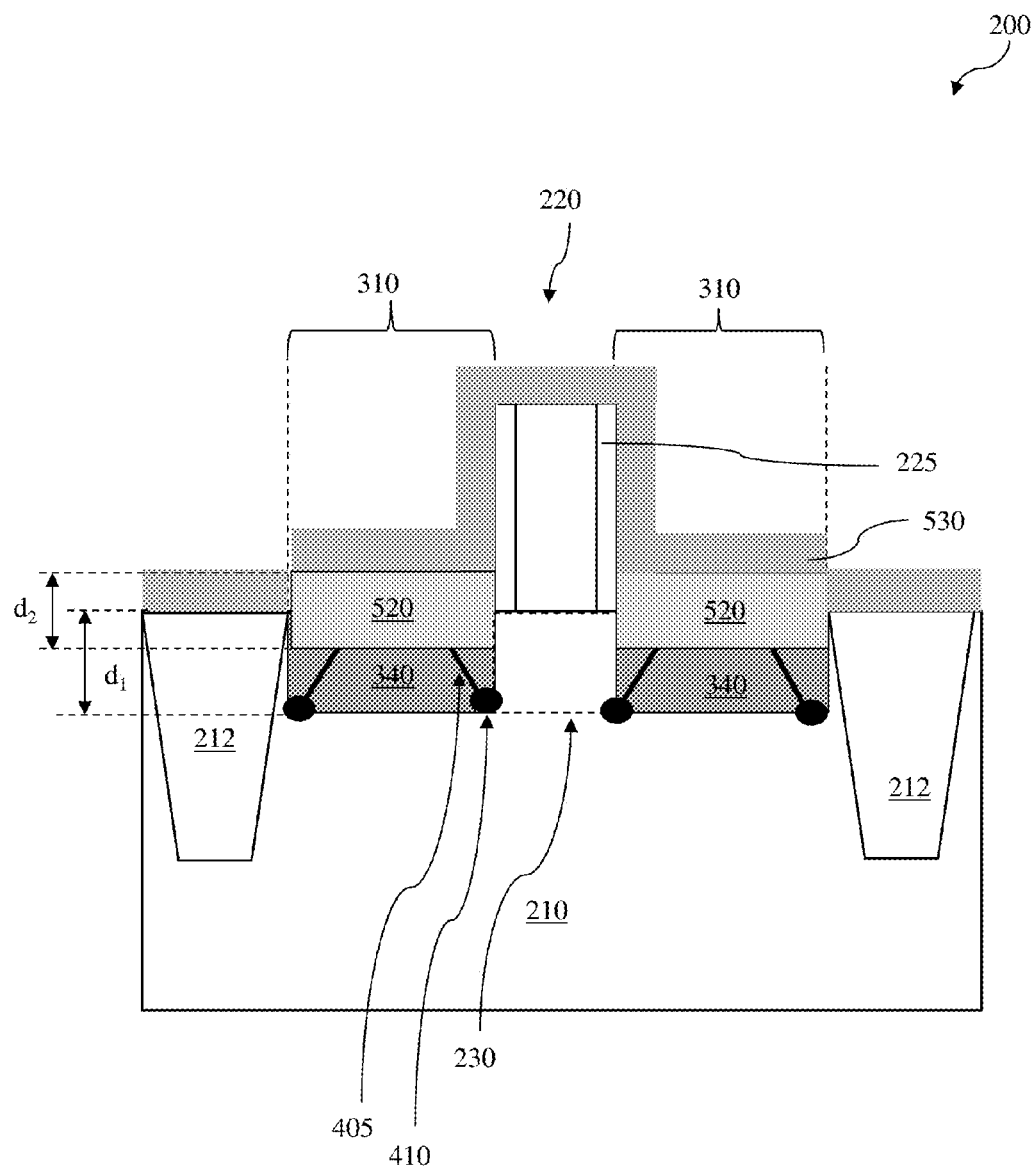

Referring to FIGS. 1 and 9, the method 100 proceeds to step 116 by forming a second SMT capping layer 530 over the substrate 210, including over the second amorphous region 520. The second SMT capping layer 530 is similar in many respects to the first SMT capping layer 330 discussed above in association with FIG. 4. In the present embodiment, the second SMT capping layer 530 is formed as a tensile stress type film.

Figure 10:
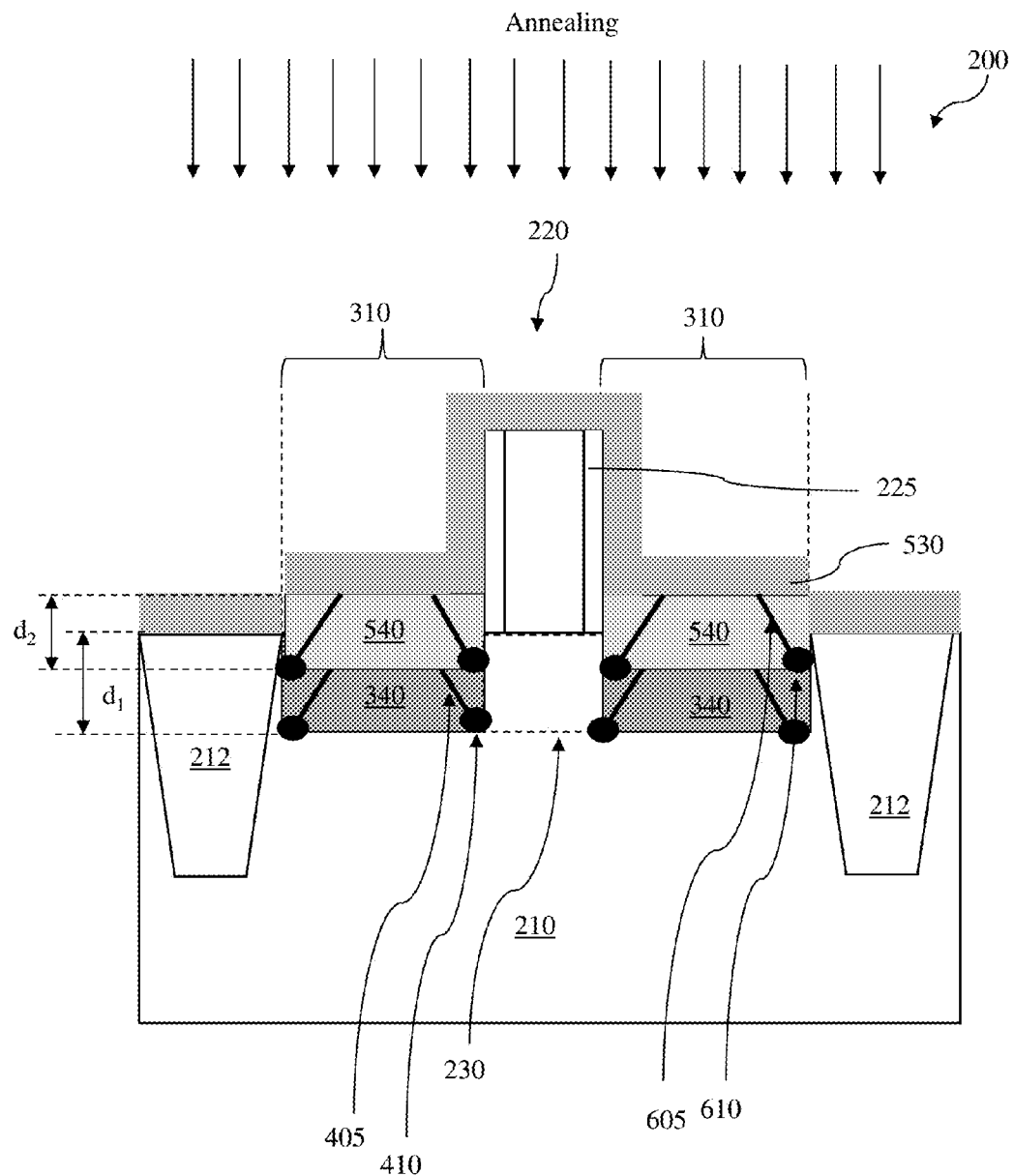

Referring to FIGS. 1 and 10, the method 100 proceeds to step 118 by applying a second annealing process to the substrate 210, including the second amorphous region 520. The second annealing process is similar in many respects to the first annealing process discussed above in association with FIG. 5. The second annealing process re-crystallizes the second amorphous regions 520 created during the second PAI, referred to as a second re-crystallization region 540. During the second annealing process, second dislocations 605 begin at a second pinch-off point 610. Depth and location of the second pinch-off point 610 are set according to design specifications and are a function of the second PAI and the second annealing process. In one embodiment, the second pinch-off point 610 locates at a bottom corner of the second re-crystallization region 540, which is at the second depth $d_2$. From the second pinch-off point 610, the dislocation 605 propagates along one or more planes towards to a top surface of the source/drain region 310.

Figure 11:
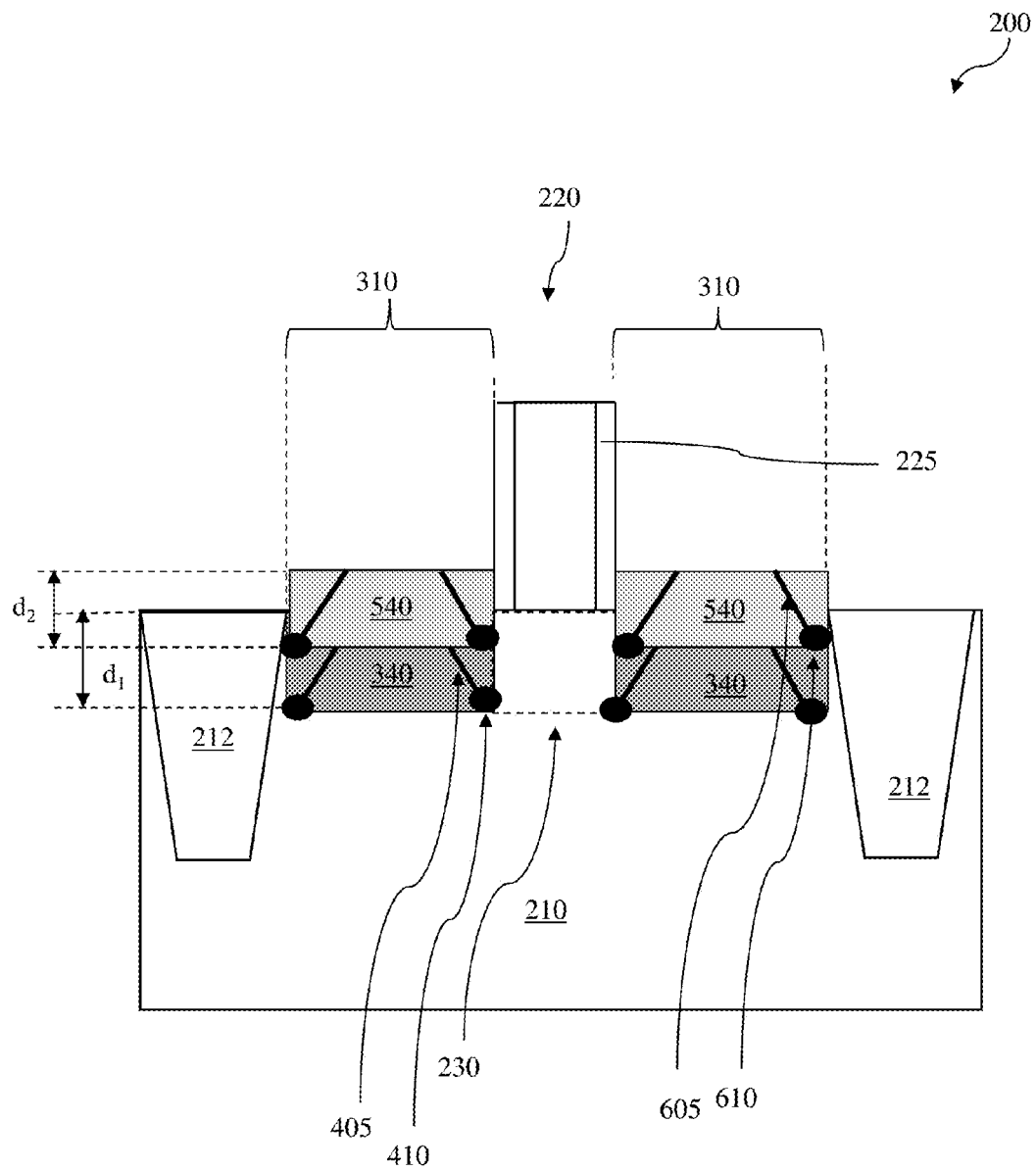

Referring to FIGS. 1 and 11, the method 100 begins at step 120 by removing the second SMT capping layer 510. The removal process is similar in many respects to the process of removing the first capping layer 330 discussed above in association with FIG. 6.

Additional steps can be provided before, during, and after the method 100, and some of the steps described can be replaced, eliminated, or moved around for additional embodiments of the method 100. The device 200 may undergo further CMOS or MOS technology processing to form various features and regions known in the art.

Based on the above, the present disclosure offers methods for fabricating IC device. The method employs forming double stress memorization technology (SMT) to provide a higher tensile stress to improve NMOS channel mobility. The method also employs using SiGe excellent selectivity to easily deposit it on NMOS source and drain silicon surface without extra mask.

The present disclosure provides many different embodiments of fabricating a semiconductor IC that provide one or more improvements over other existing approaches. In one embodiment, a method for fabricating a semiconductor integrated circuit (IC) includes providing a substrate. The substrate includes a gate stack over the substrate and source/drain regions separated by the gate stack. The method also includes forming a first dislocation with a first pinch-off point at a first depth of the source/drain region and forming a second dislocation with a second pinch-off point at a second depth of the source/drain region. The second depth is substantial smaller than the first depth.

In another embodiment, a method for fabricating a semiconductor IC includes providing a substrate. The substrate includes a gate stack over the substrate and source/drain regions separated by the gate stack. The method also includes applying a first pre-amorphization implantation (PAI) to the source/drain regions to form a first amorphous region and forming a first capping layer over the substrate, including the first amorphous region. The method also includes applying a first annealing process to the first amorphous region to form a first dislocation having a first pinch-off point at a first depth from a top surface of the source/drain region. The method also includes removing the first capping layer, forming a semiconductor layer over the first amorphous region, applying a second pre-amorphization implantation (PAI) to the semiconductor layer to form a second amorphous region. The method also includes forming a second capping layer over the substrate, including the second amorphous region, applying a second annealing process to the second amorphous region to form a second dislocation having a second pinch-off point at a second depth from a top surface of the source/drain region. The method also includes removing the second capping layer.

In yet another embodiment, a semiconductor IC device includes a substrate, a source region over the substrate, a drain region over the substrate, separated with the source region by a gate region. The device also includes a first dislocation formed within the source/drain region at a first depth from a top surface of the source/drain. The device also includes a second dislocation formed within the source/drain region at a second depth from the top surface of the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
    providing a substrate comprising a gate stack over the substrate;
    forming a gate spacer on a gate stack sidewall of the gate stack, wherein the gate spacer includes a first gate spacer sidewall interfacing with the gate stack sidewall of the gate stack and a second gate spacer sidewall opposing the first gate spacer sidewall;
    after the forming the gate spacer, forming a first dislocation with a first pinch-off point at a first depth of a source/drain region adjacent to the gate spacer, wherein the first pinch-off point is substantially vertically aligned with the second gate spacer sidewall; and
    forming a second dislocation with a second pinch-off point at a second depth of the source/drain region, wherein the second depth is substantial smaller than the first depth, and wherein the second pinch-off point is substantially vertically aligned with the first pinch-off point.

2. The method of claim 1, wherein forming the first dislocation with the first pinch-off point includes:
    applying a first pre-amorphization implantation (PAI) to the source/drain region to form a first amorphous region, wherein the first PAI is controlled to form the first amorphous region having a depth, which is equal to the first depth;
    forming a first capping layer over the substrate, including the first amorphous region;
    applying a first annealing process to the first amorphous region, wherein the first annealing process is controlled to form the first dislocation with the first pinch-off point at the first depth; and
    removing the first capping layer.

3. The method of claim 2, wherein the first PAI implants germanium species.

4. The method of claim 2, wherein the first capping layer is formed as a tensile stress type film.

5. The method of claim 2, wherein forming the second dislocation with the second pinch-off point includes:
   forming a semiconductor layer over the first amorphous region;
   applying a second pre-amorphization implantation (PAI) to the semiconductor layer to form a second amorphous region, wherein the second PAI is controlled to form the second amorphous region having a depth, which is equal to the second depth;
   forming a second capping layer over the substrate, including the second amorphous region;
   applying a second annealing process to the second amorphous region, wherein the second annealing process is controlled to form the second dislocation pinch-off point at the second depth; and
   removing the second capping layer.

6. The method of claim 5, wherein the semiconductor layer is formed over the first amorphous region by a selective deposition process.

7. The method of claim 5, wherein the second PAI implants germanium species.

8. The method of claim 5, wherein the second capping layer is formed as a tensile stress type film.

9. The method of claim 5, wherein the semiconductor layer over the first amorphous region includes SiGe.

10. A method for fabricating a semiconductor integrated circuit (IC), the method comprising:
    providing a substrate comprising a gate stack disposed over the substrate and a gate spacer disposed on a sidewall of the gate stack;
    after the providing the substrate having the gate stack and the gate spacer, applying a first pre-amorphization implantation (PAI) to a source/drain region disposed in the substrate to form a first amorphous region;
    forming a first capping layer over the substrate, including the first amorphous region, wherein a sidewall of the first capping layer physically contacts a sidewall of the gate spacer;
    applying a first annealing process to the first amorphous region to form a first dislocation having a first pinch-off point at a first depth from a top surface of the source/drain region, wherein the first pinch-off point is substantially vertically aligned with the sidewall of the gate spacer;
    removing the first capping layer;
    forming a semiconductor layer over the first amorphous region;
    applying a second pre-amorphization implantation (PAI) to the semiconductor layer to form a second amorphous region;
    forming a second capping layer over the substrate, including the second amorphous region, wherein a sidewall of the second capping layer physically contacts the sidewall of the gate spacer;
    applying a second annealing process to the second amorphous region to form a second dislocation having a second pinch-off point at a second depth from a top surface of the source/drain region; and
    removing the second capping layer.

11. The method of claim 10, wherein the first capping layer is formed as a tensile stress type film.

12. The method of claim 10, wherein the first annealing process is controlled to form the first dislocation having the first pinch-off point at the first depth.

13. The method of claim 10, wherein the first PAI implants germanium species.

14. The method of claim 10, wherein the semiconductor layer is formed over the first amorphous region by a selective deposition process.

15. The method of claim 10, wherein the second PAI is controlled to form the second amorphous region with a depth, which is equal to the second depth.

16. The method of claim 10, wherein the second capping layer is formed as a tensile stress type film.

17. The method of claim 10, wherein the second annealing process is controlled to form the second dislocation having the second pinch-off point at the second depth.

18. The method of claim 10, wherein the second PAI implants germanium species.

19. A semiconductor device comprising:
    a substrate;
    a pair of source/drain regions separated by a gate region;
    a first region in one of the pair of source/drain regions including a first material and having a first dislocation at a first depth from a top surface of the pair of source/drain regions, wherein the first dislocation has a first pinch-off point;
    a second region in the one of the pair of source/drain regions disposed over the first region, wherein the second region includes a second material and has a second dislocation at a second depth from the top surface of the pair of source/drain regions,
      wherein the second dislocation has a second pinch-off point located at a bottom corner of the second region and substantially vertically aligned with the first pinch-off point.

20. The device of claim 19, wherein the second depth is substantially smaller than the first depth.

* * * * *